United States Patent [19]

Matsushima et al.

[11] Patent Number: 5,274,915
[45] Date of Patent: Jan. 4, 1994

[54] METHOD OF MANUFACTURING A PRINTED WIRING BOARD

[75] Inventors: Yasunori Matsushima; Kunio Nishi, both of Saitama, Japan

[73] Assignee: Nippon CMK Corp., Japan

[21] Appl. No.: 717,411

[22] Filed: Jun. 18, 1991

[30] Foreign Application Priority Data

Jun. 22, 1990 [JP] Japan .................................. 2-165405

[51] Int. Cl.$^5$ .............................................. H05K 3/02
[52] U.S. Cl. ........................................ 29/846; 29/413; 29/426.1; 29/852
[58] Field of Search ................. 29/852, 413, 426.1, 29/846

[56] References Cited

U.S. PATENT DOCUMENTS 4,372,046  2/1983  Suzuki ................................. 29/852

Primary Examiner—Carl J. Arbes
Attorney, Agent, or Firm—Bruce J. Adams; Van C. Wilks

[57] ABSTRACT

The invention has been achieved to solve the problem mentioned above. The object of the invention is to provide a novel method of manufacturing a printed wiring board by allowing manufacturers to provide a slit and perforations on the substrate without causing even the slightest crack to be generated in the course of manufacturing the printed wiring board.

In the course of manufacturing printed wiring boards splittable across a slit and perforations, the method embodied by the invention executes those sequential steps including the following; provision of thickness adjusting film for specific regions adjacent to the slit and perforations; adjustment of the thickness of a main substrate and a splittable substrate which is splittable by means of the slit and the perforations; and formation of the slit and the perforations by applying a pressing and punching process.

16 Claims, 2 Drawing Sheets

METHOD OF MANUFACTURING A PRINTED WIRING BOARD

BACKGROUND OF THE INVENTION

1. Field of the Invention

The present invention relates to a method of manufacturing a printed wiring board which is splittable across a slit and a plurality of perforations.

2. Description of the Prior Art

There is presently such a conventional printed wiring board which is provided with a slit and a plurality of perforations in the course of the manufacturing process in order that main regions of the substrate can be separated from each other.

FIG. 3 illustrates a conventional printed wiring board 1 typical of the printed wiring board having the structure cited above. This conventional printed wiring board 1 consists of a main substrate 3 mounting a printed wiring circuit 2 which contains the predetermined pattern, and a split-table substrate 4 which is to be split from the main substrate 3. This conventional printed wiring board 1 is provided with a slit 5 and a plurality of perforations 6 between the main substrate 3 and the splittable substrate 4.

While forming the slit 5 and perforations 6 in the course of manufacturing a conventional printed wiring board as described above, cracks are easily generated between the perforations 6 or between the slit 5 and the perforations 6, thus causing the main substrate, 3 to be separated from the splittable substrate 4. Typically, the slit 5 and the perforations 6 are furnished to the printed wiring board 1 by means of a pressing and punching operation. However, as shown in FIG. 4, when sandwiching the printed wiring board 1 between the top and bottom molds 7 and 8, a substantial difference in thickness results between superficial areas 3a, 3b, 4a, and 4b, and those superficial areas 7a and 8a of the main and splittable substrates 3 and 4 in contact with the top and bottom molds 7 and 8.

The above difference is caused by (1) the presence or absence of the printed wiring circuit 2 on those regional surfaces 3a, 3b, 4a, and 4b of the main substrate 3 and the splittable substrate 4, and (2) the difference in thickness between those superficial regions 3a, 3b, 4a, and 4b of the main and splittable substrates 3 and 4 in contact with the top and bottom molds 7 and 8 due to the presence or absence of the undercoated or overcoated insulative film or shielding film.

SUMMARY OF THE INVENTION

The invention has been achieved to solve the problem mentioned above. The object of the invention is to provide a novel method of manufacturing a printed wiring board by allowing manufacturers to provide a slit and perforations on the substrate without causing even the slightest crack to be generated in the course of manufacturing the printed wiring board.

In the course of manufacturing printed wiring boards splittable across a slit and perforations,the method embodied by the invention executes, sequentially the following steps providing thickness adjusting film for specific regions adjacent to the slit and perforations; adjusting the thickness of a main substrate and a splittable substrate which is slittable by means of the slit and the perforations; and forming the slit and the perforations via a pressing and punching operation.

The method embodied by the invention provides thickness adjusting.film for specific regions adjacent to the slit and perforations. Due to the provision of this thickness adjusting film, even the slightest difference in thickness of the superficial regions of the main and splittable substrates adjacent to the slit and the perforations in contact with the top and bottom molds can be eliminated. As a result, manufacturers can securely prevent either cracks or separation of the main and splittable substrates from being generated in the course of pressing and punching out the slit and perforations.

DESCRIPTION OF THE PREFERRED EMBODIMENT

Referring now to the accompanying drawings, the method of manufacturing a printed wiring board embodied by the invention is described below.

Figure 1:
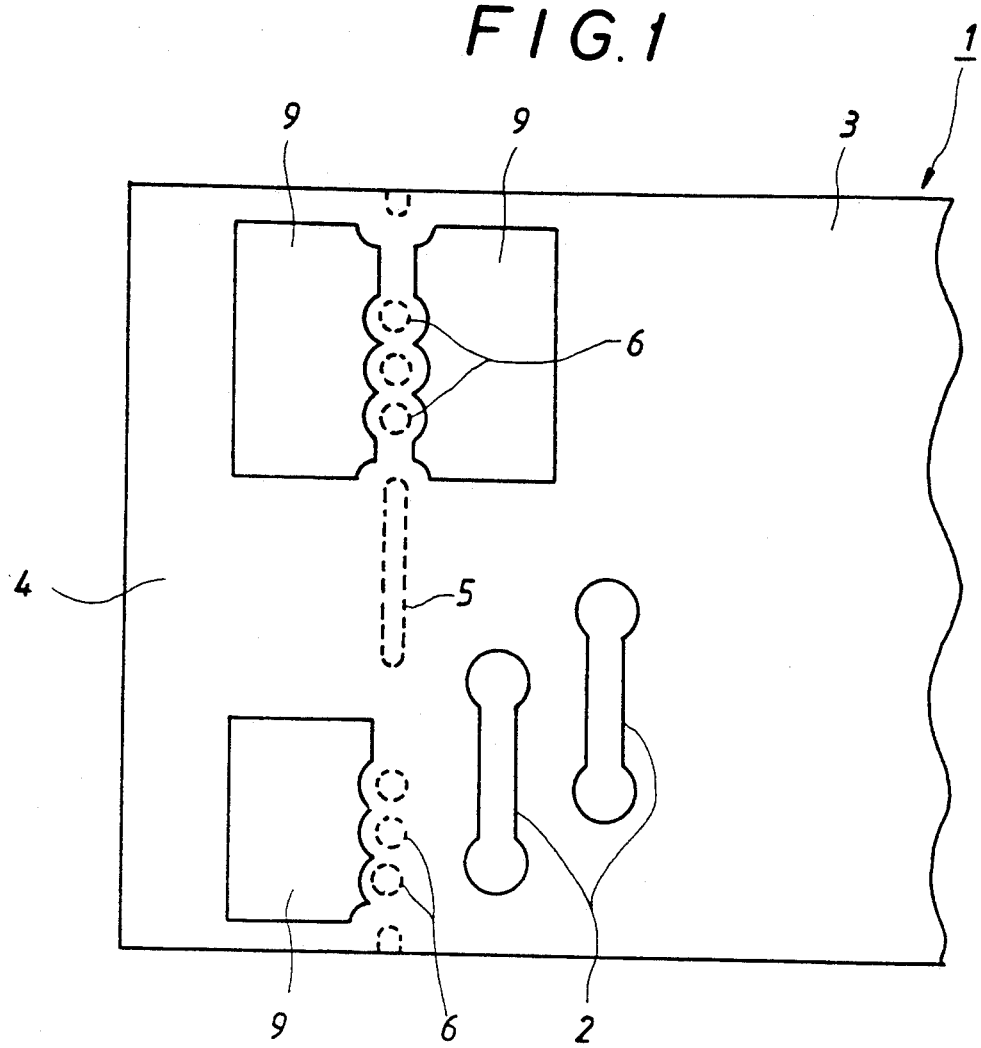
FIG. 1 is an enlarged plan of the main components of a printed wiring board reflecting the method of manufacturing the printed wiring board according to an embodiment of the invention.
Figure 2:
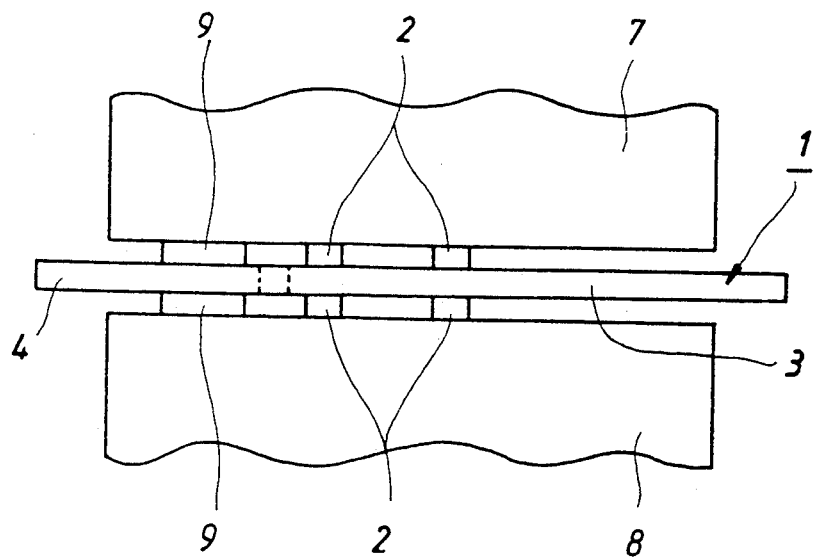
FIG. 2 is a sectional view designating the state of pressing and punching out the slit and perforations provided for the printed wiring board embodied by the invention.

FIG. 1 is an enlarged plan of main components of a printed wiring board according to an embodiment of the invention. FIG. 2 is a sectional view designating the state of executing a pressing and punching process to provide a slit and perforations for the printed wiring board.

Figure 3:
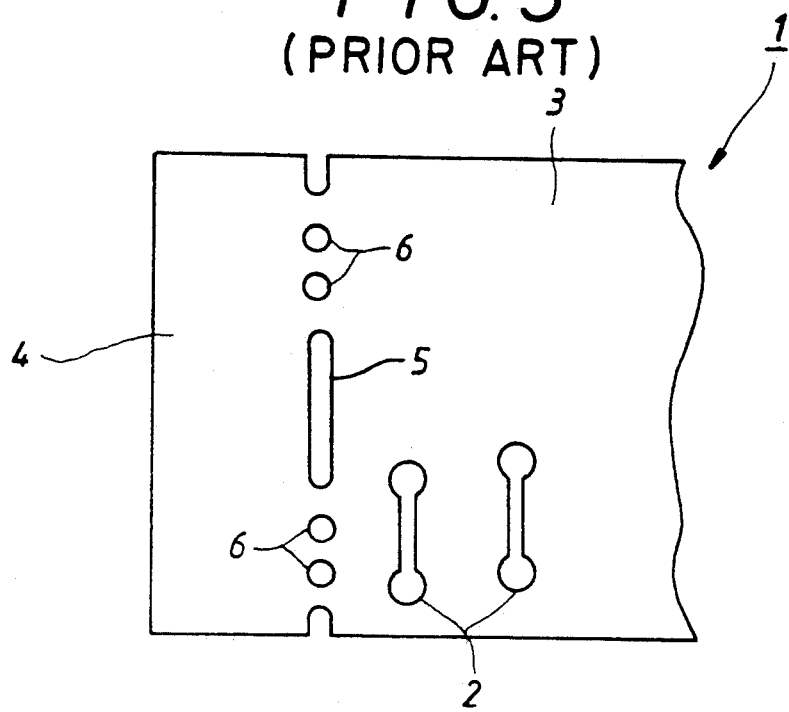
FIG. 3 is a plan of a conventional printed wiring board.

Those components of the printed wiring board 1 including the printed wiring circuit 2 and the main substrate 3 shown in FIGS. 1 and 3 are respectively designated by those reference numerals identical to those which are shown in FIG. 3, and thus description of these components is deleted.

First, a printed wiring circuit 2 is provided by applying the predetermined process to a copper coated stratified board. Next, prior to the execution of a pressing and punching process to punch out a slit 5 and a plurality of perforations 6 shown in FIG. 1 by means of broken line and circles between the main substrate 3 mounting the printed wiring circuit 2 and a splittable substrate 4 which is to be separated from the main substrate 3, the method embodied by the invention provides thickness adjusting film 9 for those regions adjacent to the slit 5 and the perforations 6.

More particularly, the thickness adjusting film 9 properly adjusts the difference in thickness between the main substrate 3 and the splittable substrate 4. Actually, there is a certain difference in the thickness between the main substrate 3 mounting the printed wiring circuit 2 and the splittable substrate 4 which is devoid of the printed wiring circuit 2. To compensate for this difference, the method coats the thickness adjusting film 9 on the surface of the splittable substrate 4 adjacent to the slit 5 and the perforations 6. Availing of the own thickness of the thickness adjusting film 9, the thickness of the splittable substrate 4 devoid of the printed wiring circuit 2 approximates the thickness of the main substrate 3 so that the thickness of both substrates can properly be adjusted.

It should be noted that the provision of the thickness adjusting film 9 does not completely offset the difference in thickness between the main and splittable substrates 3 and 4. Rather, the thickness adjusting film 9 decreases the difference in thickness just enough to prevent cracks from being generated while the pressing and punching process is underway.

Likewise, as shown in FIG. 1, the thickness adjusting film 9 is not only applicable to the surface of the splittable substrate 4, but also to the surface of the main substrate 3 situations in which the printed wiring circuit elements are provided unproportionally in those regions close to the slit 5 and the perforations 6.

Furthermore, the thickness adjusting film 9 is applicable not only to the front surfaces of the main and splittable substrates 3 and 4, but also to the back surfaces of these main and splittable substrates 3 and 4 as required.

The thickness adjusting film 9 can also be affixed by applying such thickness adjusting film which is superficially coated with insulative paint in the course of the formation of insulative film such as undercoating or overcoating used during the process of forming the printed wiring circuit 2 on the main substrate 3. Alternatively, in place of the insulative film such as the undercoating or the overcoating use, shielding paint available for the formation of shielding film can also be applied to those regions accommodating the thickness adjusting film 9 shown in FIG. 1, and therefore, there is no need for providing the thickness adjusting film 9 based on an independent formation process.

In other words, the thickness adjusting film 9 can be formed simultaneously with the process for the formation of undercoat, or overcoat, or shielding film on the printed wiring circuit 2 3.

Figure 4:
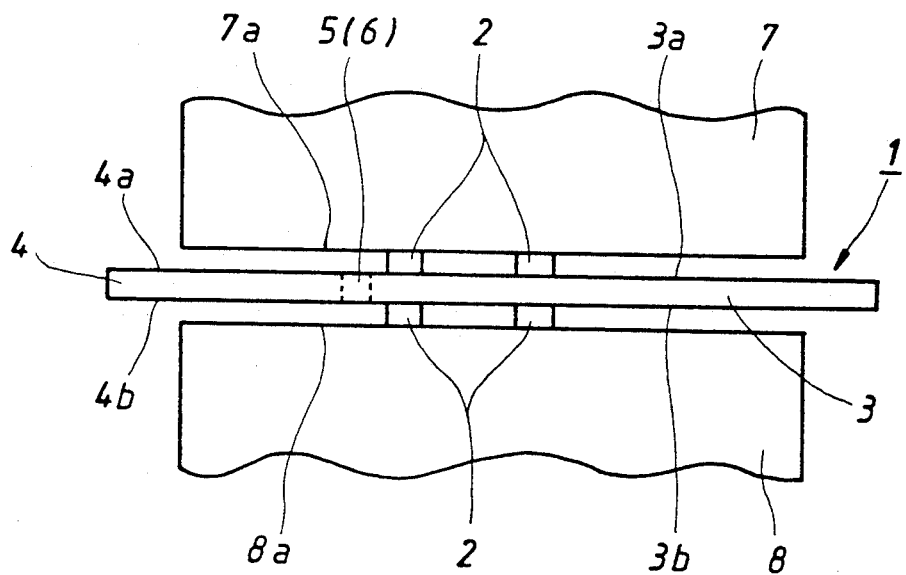
FIG. 4 is a sectional view designating the state of pressing and punching the slit and perforations.

To execute a pressing and punching process to punch out the slit 5 and the perforations 6 between the main substrate 3 and the splittable substrate 4, as shown in FIG. 4, initially, the printed wiring board 1 is sandwiched between the top and bottom molds 7 and 8 available for the pressing process before punching out the slit 5 and the perforations 6.

After completing coating of the thickness adjusting film 9 on those regions adjacent to the slit 5 and the perforations 6, the difference in superficial areas of the main and splittable substrates 3 and 4 in contact with the top and bottom molds 7 and 8 is fully offset. As a result, the top and bottom molds 7 and 8 can uniformly press those regions of the main and splittable substrates 3 and 4 close to the slit 5 and the perforations 6. This also fully eliminates distortion between the main and splittable substrates 3 and 4, and thus, even the slightest crack can be prevented from being generated in the course of pressing and punching out the slit 5 and the perforations 6.

According to the method of manufacturing the printed wiring board embodied by the invention, even the slightest crack can be prevented from being generated in the course of pressing and punching out the slit and perforations, thus securely promoting the yield in the production of the printed wiring board.

What is claimed is:

1. A method of manufacturing a printed wiring board, comprising the steps:

providing a printed wiring board having a main board portion and a separable board portion separable along a prescribed line from the main board portion;

forming a printed wiring circuit on the main board portion, thereby increasing the overall thickness of the main board portion as compared to the separable board portion;

applying an adjusting film on the separable board portion adjacent to the prescribed line to thereby increase the overall thickness of the separable board portion to more closely approximate the overall thickness of the main board portion; and punching a pattern of holes in the printed wiring board along the prescribed line by sandwiching the printed wiring board between two opposed molds subsequent to applying said adjusting film, thereby forming a weakened line along which the separable board portion may be separated from the main board portion.

2. A method according to claim 1; wherein the printed wiring board has two opposed major surfaces; and the printed wiring circuit and adjusting film are formed on one of the two opposed major surfaces.

3. A method according to claim 2; wherein the printed wiring circuit and the adjusting film are formed on both opposed major surfaces.

4. A method according to claim 1; wherein the punching step comprises punching a pattern of holes comprised of at least one elongated slit and a series of perforations extending along the prescribed line.

5. A method according to claim 1; wherein the applying step comprises applying the adjusting film on both the separable board portion and the main board portion on opposite sides of the prescribed line.

6. A method according to claim 1; wherein the adjusting film comprises an electrically insulative film.

7. A method according to claim 1; wherein the adjusting film comprises a shielding film.

8. A method of manufacturing a printed wiring board, comprising the steps;

providing a printed wiring board having two opposed major surfaces and having a printed wiring circuit on at least one of the major surfaces, the printed wiring circuit increasing the thickness of the printed wiring board as compared to other portions thereof which do not have the printed wiring circuit;

increasing the thickness of the other portions of the printed wiring board by applying an adjusting film thereto at least along one side of a prescribed line; and punching a pattern of holes in the printed wiring board along the prescribed line by sandwiching the printed wiring board between two molds to applying said adjusting film, thereby forming a weakened line along which the printed wiring board may be separated.

9. A method according to claim 8; wherein the increasing step comprises applying an adjusting film to the other portions of the printed wiring board to increase the thickness thereof.

10. A method according to claim 9; wherein the printed wiring circuit and the adjusting film are formed on both opposed major surfaces.

11. A method according to claim 10; wherein the punching step comprises punching a pattern of holes comprised of at least one elongated slit and a series of perforations extending along the prescribed line.

12. A method according to claim 10; wherein the adjusting film comprises an electrically insulative film.

13. A method according to claim 10; wherein the adjusting film comprises a shielding film.

14. A method according to claim 9; wherein the punching step comprises punching a pattern of holes comprised of at least one elongated slit and a series of perforations extending along the prescribed line.

15. A method according to claim 14; wherein the adjusting film comprises an electrically insulative film.

16. A method according to claim 14; wherein the adjusting film comprises a shielding film.

* * * * *